(12) United States Patent
Carpier et al.

(10) Patent No.: US 6,568,600 B1
(45) Date of Patent: May 27, 2003

(54) CHIP CARD EQUIPPED WITH A LOOP ANTENNA, AND ASSOCIATED MICROMODULE

(75) Inventors: Roland Carpier, Montigny le Bretonneux (FR); Christine Lauvernier, Bougival (FR); Alain Le Loc'h, Versailles (FR)

(73) Assignee: Bull CP8, Louveciennes (FR)

( * ) Notice: Subject to any disclaimer, the term of this patent is extended or adjusted under 35 U.S.C. 154(b) by 0 days.

(21) Appl. No.: 09/646,402

(22) PCT Filed: Jan. 19, 2000

(86) PCT No.: PCT/FR00/00110

§ 371 (c)(1),
(2), (4) Date: Sep. 18, 2000

(87) PCT Pub. No.: WO00/43951

PCT Pub. Date: Jul. 27, 2000

(30) Foreign Application Priority Data

Jan. 19, 1999 (FR) .............................................. 99 00486

(51) Int. Cl.⁷ .............................................. G06K 19/06
(52) U.S. Cl. ...................................... 235/492; 235/487
(58) Field of Search ................................. 235/492, 487; 343/788, 866; 29/600

(56) References Cited

U.S. PATENT DOCUMENTS

| | | | | | |
|---|---|---|---|---|---|
| 4,822,988 A | * | 4/1989 | Gloton | ........................ | 235/492 |
| 5,612,532 A | * | 3/1997 | Iwasaki | ....................... | 235/486 |
| 5,671,525 A | | 9/1997 | Fidalgo | | |
| 6,095,423 A | * | 8/2000 | Houdeau et al. | ............. | 235/487 |
| 6,142,381 A | * | 11/2000 | Finn et al. | ................... | 235/492 |
| 6,161,761 A | * | 12/2000 | Ghaem et al. | ............... | 235/492 |

FOREIGN PATENT DOCUMENTS

| | | |
|---|---|---|
| DE | 196 32 115 C | 9/1997 |
| WO | WO 97 34247 A | 9/1997 |

* cited by examiner

Primary Examiner—Thien M. Le
Assistant Examiner—Lisa M. Caputo
(74) Attorney, Agent, or Firm—Edward J. Kondracki; Miles & Stockbridge P.C.

(57) ABSTRACT

A chip card includes a body of electrically insulating layers, one of which carries an open loop antenna having two ends. The body is equipped with a cavity for housing a micromodule adapted for connection to the antenna by two terminals. The micromodule includes an insulating substrate carrying, on a first side, a semiconductor component, and on a second side, several electrical contact pads. Two of the contact pads are disposed in a strip running through a center region of the substrate. The terminals are connected to the two contact pads through the substrate, and the two pads are respectively connected to ends of the antenna.

13 Claims, 7 Drawing Sheets

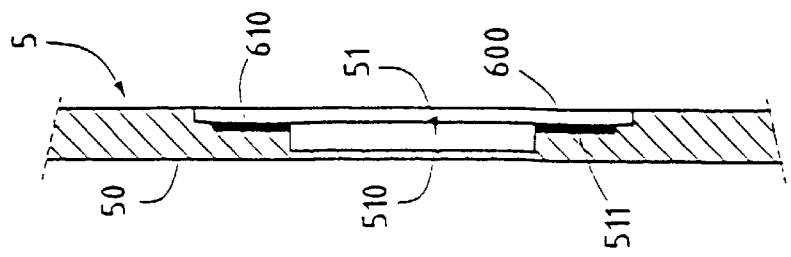
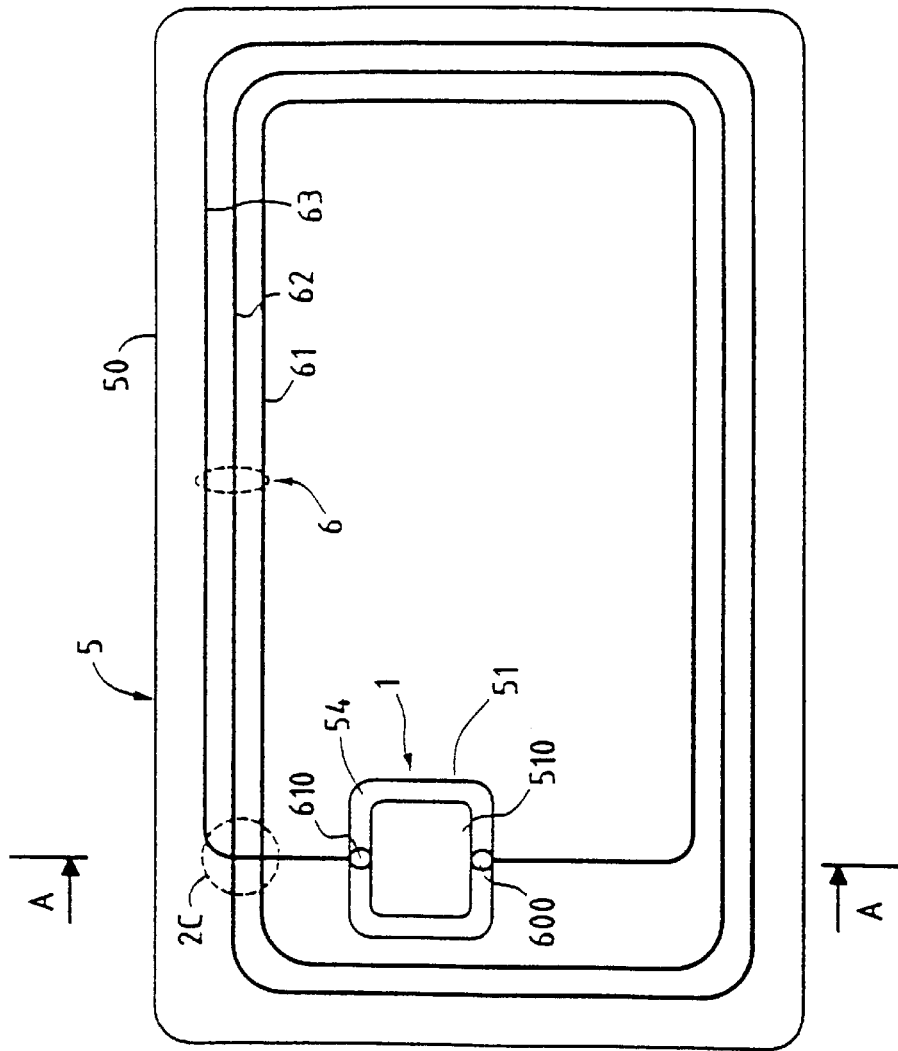
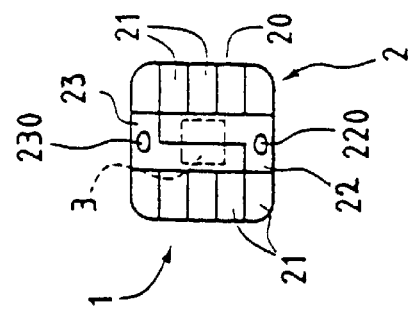

US 6,568,600 B1

CHIP CARD EQUIPPED WITH A LOOP ANTENNA, AND ASSOCIATED MICROMODULE

FIELD OF THE INVENTION

The present invention relates to a chip card equipped with an open loop antenna, particularly a chip card of the so-called "mixed connection" type, which will be defined below.

Within the framework of the invention, the term "card" should be understood in its most general sense: smart card, "chip" Integrated Circuit (I.C.) card, card, etc.

DESCRIPTION OF RELATED ART

In terms of the mode of communication with the outside world, there are two main categories of chip cards: chip cards with chip cards and contacts without contacts. In the second case, various methods can be used to establish communication between the card and the outside world. It is possible to use, in particular an optical coupling or an electromagnetic coupling by means of a spiral loop antenna. The invention relates to the second type of coupling.

The majority of chip cards are of the first type, i.e., contact cards. These chip cards are made from "micromodules," i.e. packages comprising a printed circuit or a metal grid having contacts to which integrated circuit components—memories, microprocessors, microcontrollers, etc.—are bonded and wired. These components are then protected by a coating resin in order to make the micromodules usable for the final mounting operation. The latter consists of bonding the micromodules into a plastic support comprising a cavity designed to receive this micromodule.

Cards of the second type, called "contactless" cards, are coupled with the outside environment by electromagnetic induction. The frequencies used are divided into two ranges: a low frequency range, the nominal frequency typically being 125 kHz, and a high frequency range, the nominal frequency typically being 13.56 MHz. For this purpose, an antenna is provided, which normally exists in the form of a spiral loop, connected by its ends to the aforementioned micromodule. In order to obtain adequate sensitivity, it is necessary to provide an antenna comprising about a hundred coils if working at low frequency and 2 to 3 coils if working at high frequency.

The current technologies used for the production of chip cards make it possible to integrate the aforementioned antennas into the material of the chip card, more precisely between two layers of plastic material. The coils are actually disposed on layers of plastic material of the "PVC" or "PET" type. The metal layers can be printed on the plastic (for example by serigraphy) or produced by depositing a metal lead, produced directly by thermal soldering on the plastic layer.

Finally, there are so-called "mixed" chip cards, which constitute the preferred field of application of the invention. This type of chip card has the advantage of allowing access both via "conventional" contacts, which makes it possible to use them in standard readers, or by passing in proximity to suitable transmitting-receiving devices, the micromodules comprising a high-frequency interface. The term "reader" should be understood in a general sense, i.e. a device that allows the reading and/or writing of digital information in a chip card.

In the following, we will consider this preferred application, i.e. the case of "mixed" chip card.

Generally, chip cards are standardized and comply with certain standards, from both an electrical and a mechanical point of view, particularly the following standards:

ISO 7816 for contact chip cards
ISO 14443 for contactless proximity chip cards.

In the latter case, the frequency used is generally equal to 13.56 MHz, which reduces the size of the antenna, the latter comprising only two or three coils.

The availability of components for "mixed" chip cards has lead to the design of novel assembly processes. Keeping in mind that this type of component is mass produced, it is necessary for the final cost price to be as low as possible. Moreover, it is also necessary to obtain high reliability, as in the case of a conventional contact chip card.

For all these reasons, it is desirable to continue to use, insofar as possible, assembly processes and technologies of the prior art that have been tried and tested. Among these processes are the following, to give a non-exhaustive list:

the mounting of the semiconductor micromodule onto a substrate of the printed circuit type, equipped with galvanic contact pads;

the production of the plastic support of the chip card itself, by pressing a stack of layers of plastic material; and the mounting by bonding of the micromodule into a cavity of the plastic support.

It is still necessary, however, to connect the semiconductor component or "chip" to the antenna, and more precisely to the ends of the antenna, which poses a specific problem. The connection is produced via connection pads that must be connected to the aforementioned ends.

In the prior art, it has been suggested that this connection be produced by means of a printed circuit that is two-sided, i.e. comprising metal tracks, for example made of copper, on both sides of an insulating substrate. The substrate in this case is a two-sided printed circuit. The solution has the drawback of a high cost. Because of this, it does not meet at least one of the requirements mentioned.

Furthermore, even if a high frequency is used (typically 13.56 MHz), the antenna is constituted by an open loop, generally comprising at least two or three coils. Therefore, at one point or another on the surface of the chip card, there is necessarily a crossing of two conductive tracks, directly over one another. It follows that it is necessary to provide an insulating area and a conductive "bridge" between two antenna sections.

SUMMARY OF THE INVENTION

The main object of the invention is to provide an optimized connection that makes it possible to connect the conductive pins of the micromodule of the chip card to the ends of the antenna. It makes it possible, in particular, to minimize the number of metal layers, either at the micromodule level or at the antenna level. It is preferably applied to chip cards of the "mixed" type.

For this reason, according to an essential characteristic of the invention, the active side of the substrate carrying the integrated semiconductor component, i.e. the contact pad side, is used to establish electrical connections between input/outputs of the component and coupling antenna terminations.

In a second embodiment, contact pads on the active side of the substrate are also used to establish electrical connections between antenna sections.

The subject of the invention is a chip card comprising a basic body of electrically insulating layers, the card carrying on one of its layers an open loop antenna having two ends, said body being equipped with a cavity housing a micromodule designed to be connected to said open loop antenna by two terminals, said micromodule comprising an electrically insulating substrate carrying, on a first side, a semiconductor component, and on a second side, several electrical contact pads, characterized in that two contact pads are disposed in a strip running through a center region of the substrate, said terminals respectively being connected to said two contact pads through said substrate, the two contact pads respectively being connected to the two ends of the antenna.

The invention also relates to a micromodule designed to be connected by two terminals to an open loop antenna outside the micromodule and having two ends, said micromodule comprising an electrically insulating substrate carrying, on a first side, a semiconductor component, and on a second side, several electrical contact pads, characterized in that two contact pads are disposed in a strip running through a center region of the substrate, said terminals respectively being connected to said two contact pads through said substrate, the two contact pads being designed to be respectively connected to the two ends of the antenna.

Finally, the invention relates to a method for producing a chip card comprising an antenna having two ends, from at least two layers of electrically insulating material, and from a micromodule comprising an electrically insulating substrate carrying, in a center region and on a first side, a semiconductor component, and in a peripheral region and on the first side or a second side, two contact pads connected to two antenna input/output terminals of the semiconductor component, the contact pads being disposed in such a way that once the micromodule is applied to the card, the two contact pads face said ends of the antenna, comprising the following steps:

preparing a first layer carrying said antenna on one side;

preparing a second layer having two through-holes disposed so that once the second layer is applied to the side of the first layer carrying the antenna, said holes face said ends of the antenna;

applying and attaching the second layer to the side of the first layer carrying the antenna;

applying the micromodule to the card so that its semiconductor component is housed in a center well formed in the card, and so that its peripheral region is housed in a peripheral well disposed around the center well;

connecting the contact pads of the micromodule and the ends of the antenna to one another.

BRIEF DESCRIPTION OF THE DRAWINGS

The invention will be better understood, and other characteristics and advantages will emerge through the reading of the following description in reference to the attached figures, in which:

FIGS. 2A through 2C, respectively, illustrate a chip card equipped with an antenna connected to a micromodule, a top view of a micromodule of the type of FIG. 1, and a sectional side view of this same chip card along AA of FIG. 2A;

DESCRIPTION OF THE PREFERRED EMBODIMENTS

Figure 1:
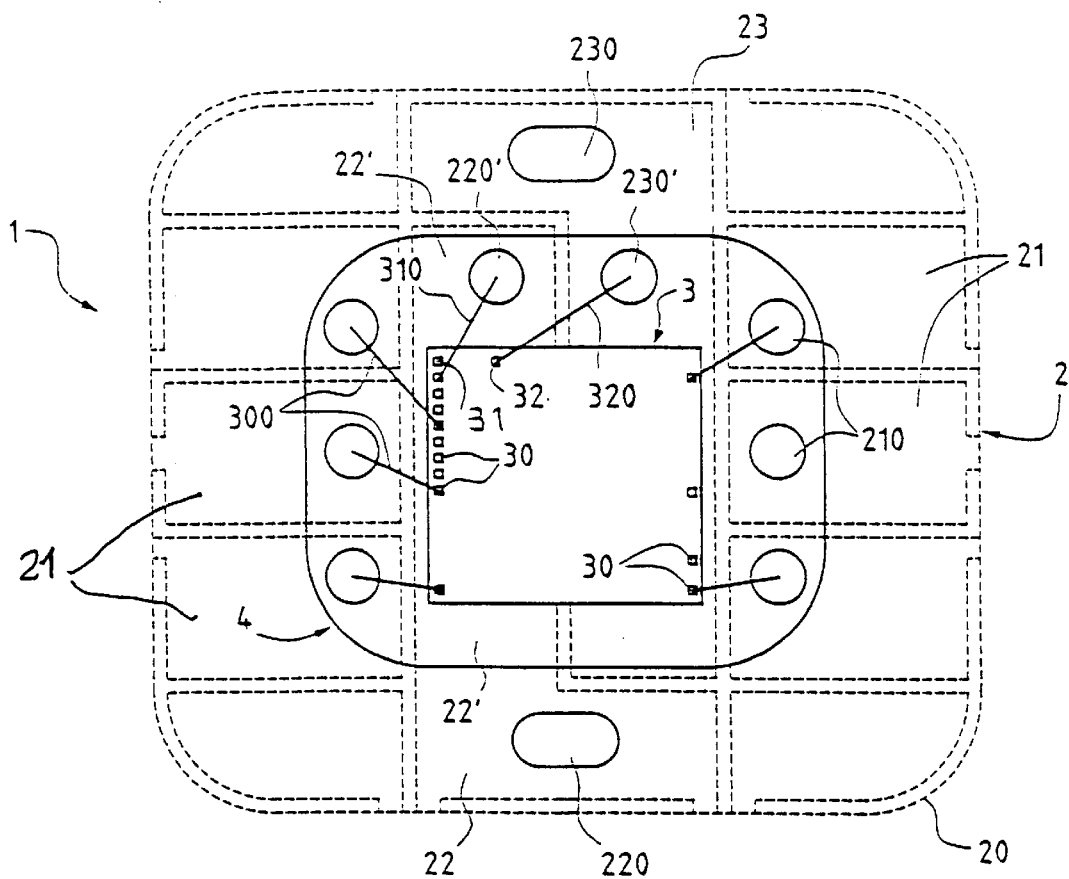
FIG. 1 schematically illustrates an exemplary embodiment of a micromodule, on the component side.

FIG. 1 schematically illustrates an exemplary micromodule 1 usable within the framework of the invention. In reality, it comprises two main parts. The micromodule 1 is seen from underneath, i.e. from the side opposite the side with the electrical contact pads.

The first part is constituted by the electronic "chip" 3 itself, i.e. an integrated semiconductor component, generally in the shape of a parallelepipedic rectangle and very thin, for example a microprocessor or the equivalent. The microprocessor 3 comprises pins or input/output terminals 30, disposed on the periphery. The configuration, the function, and the number of these input/outputs naturally depends on the exact component 3 used. The microprocessor 3 specifically includes two specific input/output terminals 31 and 32, generally contiguous and communicating with a so-called "HF" interface (not represented).

The second part consists in a substrate 2 constituted by a one-sided printed circuit 20, to which the semiconductor component 3 is bonded in a center region. The substrate comprises two rows of conductive pads 21 disposed on the periphery (represented in dotted lines, since disposed on the top side), these rows being apart from one another and separated by an area extending in the form of a strip running through the center region of the substrate. Each row includes five conductive pads 21 disposed in line. The number and the configuration of the conductive pads 21 generally conform to the above-mentioned ISO standards. The necessary connections between the pins 30 and the pads 21 are conventionally provided by thin conductive leads 300. More precisely, openings 210 are provided in the insulating layer of the substrate 2 for accessing the conductive pads 21 and connecting the two sides of the substrate 2.

Once the connections between the input/output terminals 30 of the semiconductor component 3 and the pads 21 are produced, the back of the substrate 2 is coated with a resin, in order to guarantee good mechanical strength, and additionally, to electrically insulate it. The delimitation of the coating is represented by the reference 4.

Up to this point, the operations described are entirely conventional and common to the prior art. In order to connect the ends of the loop antenna 6 (terminations 600 and 610, FIG. 2A), two additional conductive pads are provided, disposed in the aforementioned strip of the substrate 2, respectively 22 and 23. These pads are advantageously disposed symmetrically, on either side of the component 3. Two openings 220 and 230 passing through the substrate are also provided, giving access to the opposite sides of the conductive pads. The pads 22 and 23 are electrically insulated from one another and from the other conductive pads 21.

According to an essential characteristic of this embodiment of the invention, at least one of the contact pads, the contact pad 22 in the example described in FIG. 1, extends from one edge of the substrate 2 toward the opposite edge, passing over the semiconductor component 3, until it reaches approximately the edge of the coating area 4. In FIG. 1, we see that the two conductive pads 22, 23 are shaped like an L WHOSE small branch extends approximately along the outside of the coating area 4, parallel to the edge of the substrate 2, and whose large branch extends toward the opposite edge of the substrate. In a variant of embodiment, the contact pad 23 could stop near the edge of the semiconductor component 3, without passing over it.

The contact pad 22 comprises an opening 220' inside the coating area 4, on the side opposite the opening 220. For the input/output terminal 31, the opening 220' plays the role of the opening 210. Likewise, the additional contact pad 23 comprises an opening 230', inside the coating area 4, but located on the same side as the opening 230. Because of this, one of the input/output terminals, the terminal 31, can be connected to the plated pad 22-22' via a lead 310, while the other one, the terminal 32, can be connected to the plated pad 23 via a lead 320.

There will now be described exemplary embodiment of a chip card according to the invention in reference to FIGS. 2A through 2C. The chip card 5 is a mixed type. It uses a micromodule 1 of the type illustrated by FIG. 1.

The latter is shown from the top in FIG. 2B, i.e. from the side with the electrical contacts 21. As indicated, in addition to the "conventional" contact pads 21 for allowing a dialog with an equally conventional "card reader" type of device (not represented), two additional pads 22 and 23 are provided for connecting the terminations 600 and 610 of a loop antenna 6 (FIG. 2A).

It is assumed that the frequency used is chosen from the high-frequency range (13.56 MHz). The antenna comprises at least one coil, more generally two or three, if the aforementioned frequency is used. In the example described, it is assumed that the antenna, referenced 6, comprises three coils 61 through 63. This antenna 6 is substantially flat, the coils 61 through 63 being concentric and advantageously surrounding the area in which the micromodule 1 is installed, in order to have the largest surface area possible, and hence maximum sensitivity. In the example described, the coils 61 through 63 are substantially rectangular, i.e. the same shape as the chip card 5.

The position of the micromodule 1 is determined, a priori, by the specifications of the aforementioned standards, i.e. in an area located in the upper left quarter of the chip card (seen from above, as illustrated by FIG. 2A).

An open cavity 51, in which the module 1 is disposed, is provided in the body 50 of the chip card 5. More precisely, as seen in FIG. 2C (in a sectional side view along AA of FIG. 2A), this cavity 51 comprises two areas, a center well 510 for containing the component 3 and its resin coating 4, and a less deep peripheral groove 511, on the bottom of which rests the periphery of the substrate 2. The openings 220 and 230 are disposed directly over the bottom of the peripheral groove 511.

Finally, according to one characteristic of the invention, the terminations 600 and 610 end at the bottom of this groove 511. They advantageously have the shape of relatively large conductive pads.

It is therefore easy to produce a connection between these antenna termination pads 600 and 610 and the pads 22 and 23 of the substrate 2. The layout adopted by the invention allows for a wide manufacturing tolerance. It is also clear that in this center region, there is only one layer of plating.

The establishment of electrical conductivity between the micromodule 1 and the ends of the antenna 6 can be obtained by means that are themselves conventional, including: conductive adhesive, conductive elastomer, solder, deformation and thermal soldering of the metal of the substrate 2 to the pads 600 and 610.

The chip card 5 of the variant of embodiment just described in reference to FIGS. 2A through 2C clearly meets the stated objects of the invention.

However, one drawback remains. In essence, the antenna 6 comprises, in general, a minimum of two or more coils. No matter what the configuration adopted, there necessarily exists, at one place or another on the surface of the chip card 5, one or more crossings of conductive tracks. In FIG. 2A, we see that the terminal part of the coil 63 crosses the coils 61 and 62, in an area referenced 2C. To avoid a short circuit, it is necessary to provide insulation between these various conductive tracks. This can be done by producing several layers of plating, for example providing an insulating layer and a conductive "bridge." This solution, however, is not always satisfactory.

Also, according to another aspect of the invention, the intermediate sections of the coils of the antenna 6 are made to run between its terminations 600 and 610, i.e. in the center area where the cavity 51 is located.

Figure 3A:
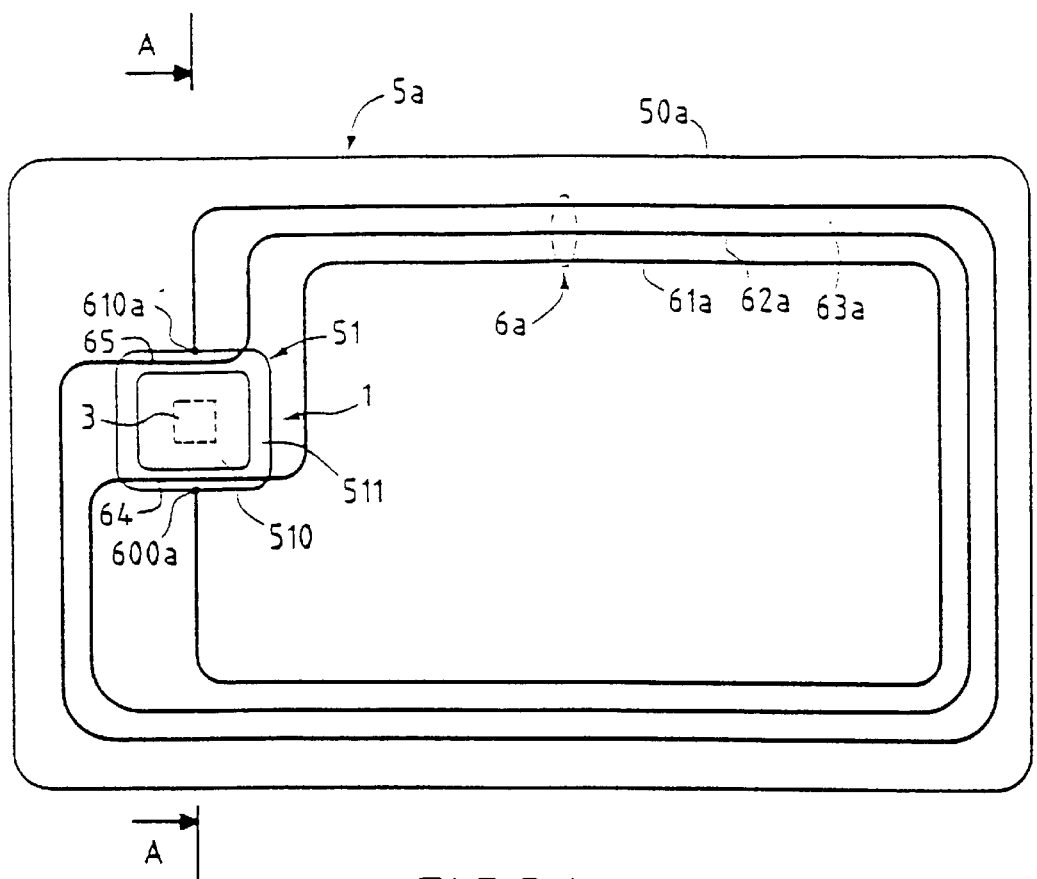
FIGS. 3A and 3B, respectively, illustrate a chip card equipped with an antenna connected to a micromodule, and a sectional side view of this same chip card along AA of FIG. 3A, according to an additional variant of embodiment.
Figure 3B:
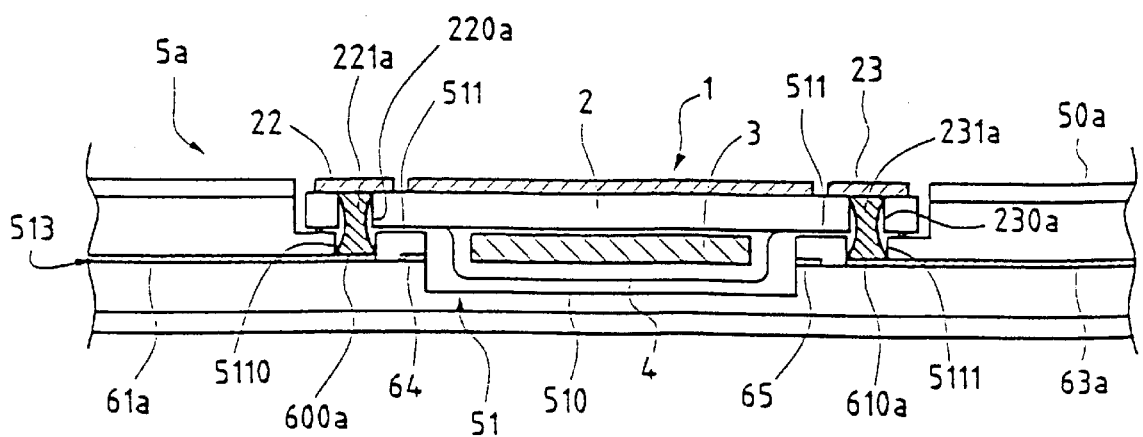

A first variant of this second embodiment will be described in reference to FIGS. 3A and 3B. FIG. 3A schematically illustrates the chip card, here referenced 5a, in a top view, and FIG. 3B illustrates this same chip card 5a in a sectional side view along AA of FIG. 3A, the micromodule 1 being mounted.

The elements common, or at least similar, to those represented in the previous figures have the same references and will be described again only as necessary. However, they are associated with the letter "a" if any structural modifications exist.

According to the chief characteristic of this embodiment, the antenna segments 6a establishing a connection between two successive coils, for example 61a to 63a, the segments 64 and 65 pass between the antenna terminations 600a and 610a. More precisely (FIG. 3B), a plating of the coils of the antenna is provided on an intermediate level 513, between the bottom of the peripheral groove 511 of the cavity 51 and the bottom of the center well 510 of this cavity. The antenna terminations end in the form of two pads 600a and 610a, underneath the bottom of the peripheral groove 511, and contact is established with the additional contact pads 22 and 23, respectively. The coils 61a through 63a themselves are also produced on this level, which corresponds to the top side of a layer of plastic material of the chip card 5a.

Holes 5110 and 5111 are provided in the bottom of the peripheral groove 511, directly above the additional conductive pads 22 and 23, respectively, and the corresponding openings 220a and 230a. The connections between the contact pads 22 and 23 and the antenna termination pads 600a and 610a are physically produced by conductive pins 221a and 231a, respectively. These pins are produced, as for FIGS. 2A through 2C, by various means, and could be replaced, in a variant of embodiment not represented, by a deformation of the contact pads in the direction of the antenna terminations, or by a raising of these terminations toward the contact pads.

This operation does not require great precision. In fact, the layer of insulating material overlying the level 513 on which the antenna platings are produced, can be pre-pierced, i.e. the holes 5110 and 5111 in the insulating layer can be produced before the latter is applied to the antenna, which avoids any risk of destroying the pads 600a and 610a. This risk would be real if the piercing were done after the insulating layer had been produced, for example through machining by means of a drill, the thickness of the plating being very slight. Typically, for a card thickness of about 800 µm, the thickness of the plating is several tens of µm. The diameter of the holes 5110 and 5111 is on the order of one millimeter, while their depth is on the order of 150 µm.

It is assumed that the area of the plating level 513 located directly underneath the bottom of the peripheral groove 511 has enough width to allow the free passage of at least one additional track between the inner edge that borders the center well 510 and the aforementioned pads 600a and 610a.

In the example described, the conductive track segment 64 is disposed between the termination 600a and the semiconductor component 3, and the conductive track segment 65 is disposed between the termination 610a and this same semiconductor component 3. In other words, the segments 64 and 65 are located on either side of the semiconductor component 3. In a variant not represented, the two segments 64 and 65 could be disposed on the same side of the semiconductor component 3, as long as enough space were left open.

It is easy to see that all of the platings forming the antenna are strictly in the same plane, i.e. at the level of the bottom of the peripheral groove 511. This plane is advantageously located in a middle region, seen in the thickness of the card, thus facilitating the obtainment of a very flat card.

The plating layout just described is particularly suitable when the semiconductor component 3 is of relatively small length. Otherwise, the additional variants of embodiment described below are preferred.

A first additional variant of embodiment will now be described in reference to FIGS. 4A and 4B.

Figure 4A:
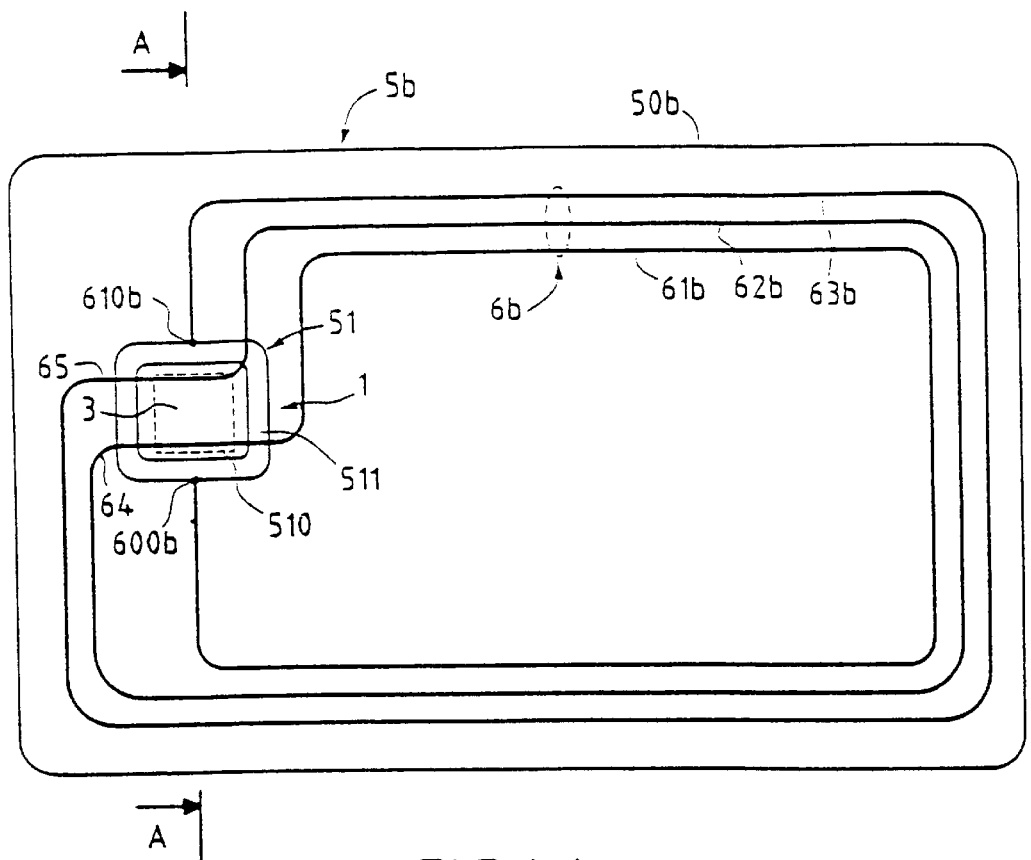
FIGS. 4A and 4B, respectively, illustrate a chip card equipped with an antenna connected to a micromodule, and a sectional side view of this same chip card along AA of FIG. 4A, according to a second additional variant of embodiment.
Figure 4B:
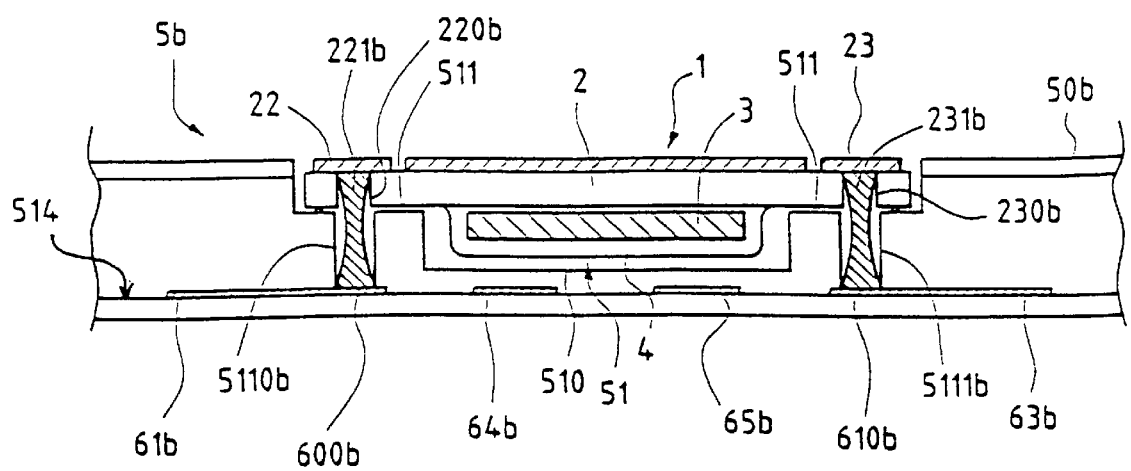

FIG. 4A schematically illustrates the chip card, here referenced 5b, in a top view, and FIG. 4b illustrates this same chip card 5a in a sectional side view along AA of FIG. 4A, the micromodule 1 being mounted.

The elements common, or at least similar, to those represented in the previous figures have the same references, and will be described again only as necessary. However, they are associated with the letter "b" if any structural modifications exist.

The connecting segments 64a and 65b between the coils 61 b through 63b of the antenna 6b pass underneath the bottom of the cavity 51 on a plate on a level referenced 514. The coils themselves, 61b through 63b, are also produced on this level, which corresponds to the top side of one of the layers of plastic material of the chip card 5b. The pins 221b and 231b are slightly longer than the corresponding pins 221a and 231a (FIG. 3B), which is not a notable drawback.

It is clear that this layout allows even greater wiring latitude, since the entire surface area of the bottom of the cavity 51 can be used, no matter what the dimensions of the semiconductor component 3. As before, the plating of the antenna 6b is done on only one level (level 514).

However, one minor drawback remains, the aesthetic design. In essence, this arrangement does not allow enough space for a material of the "crystal PVC" type, i.e. transparent on the outside of the chip card, leaving the coils of the antenna visible.

Figure 5A:
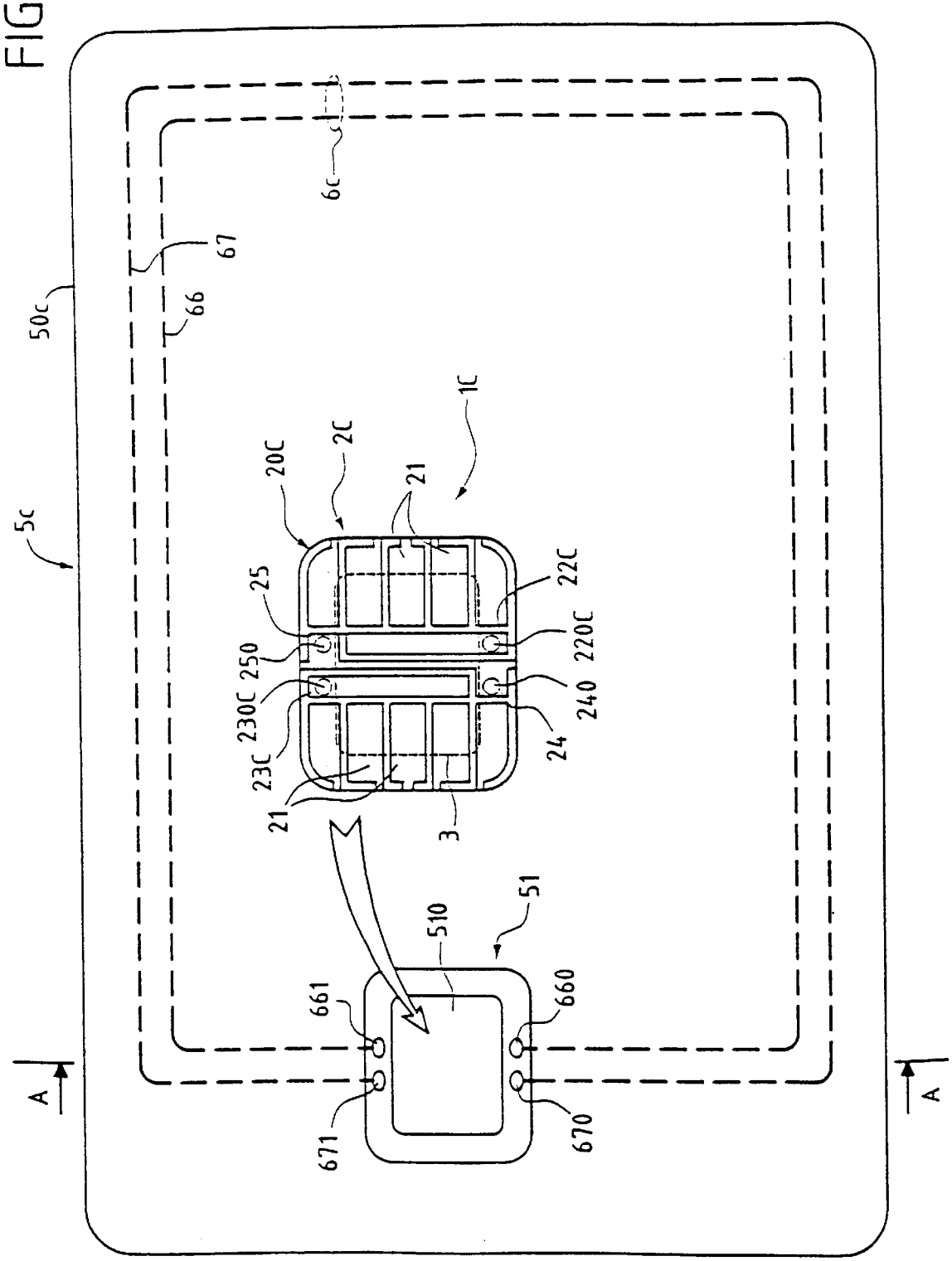
FIGS. 5A and 5B, respectively, illustrate a chip card equipped with an antenna connected to a micromodule and a sectional side view of this same chip card along AA of FIG. 5C, according to a third additional variant of embodiment.
Figure 5B:
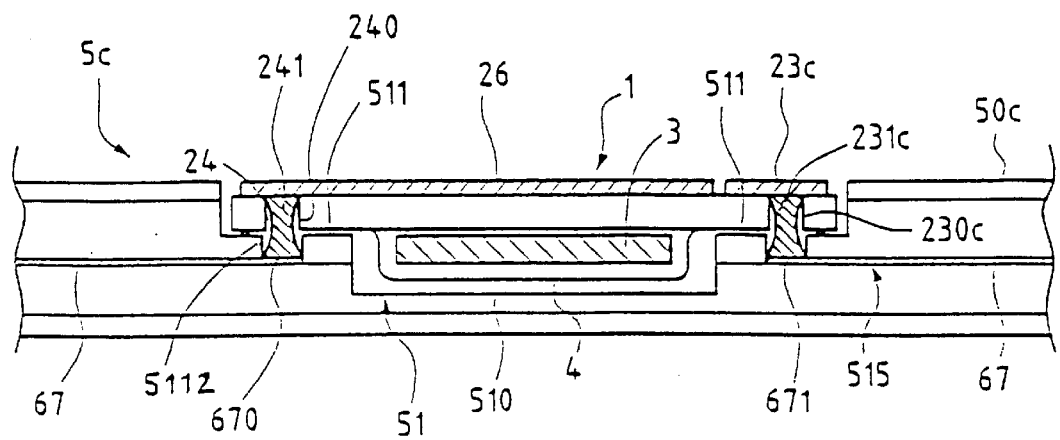
Figure 5C:
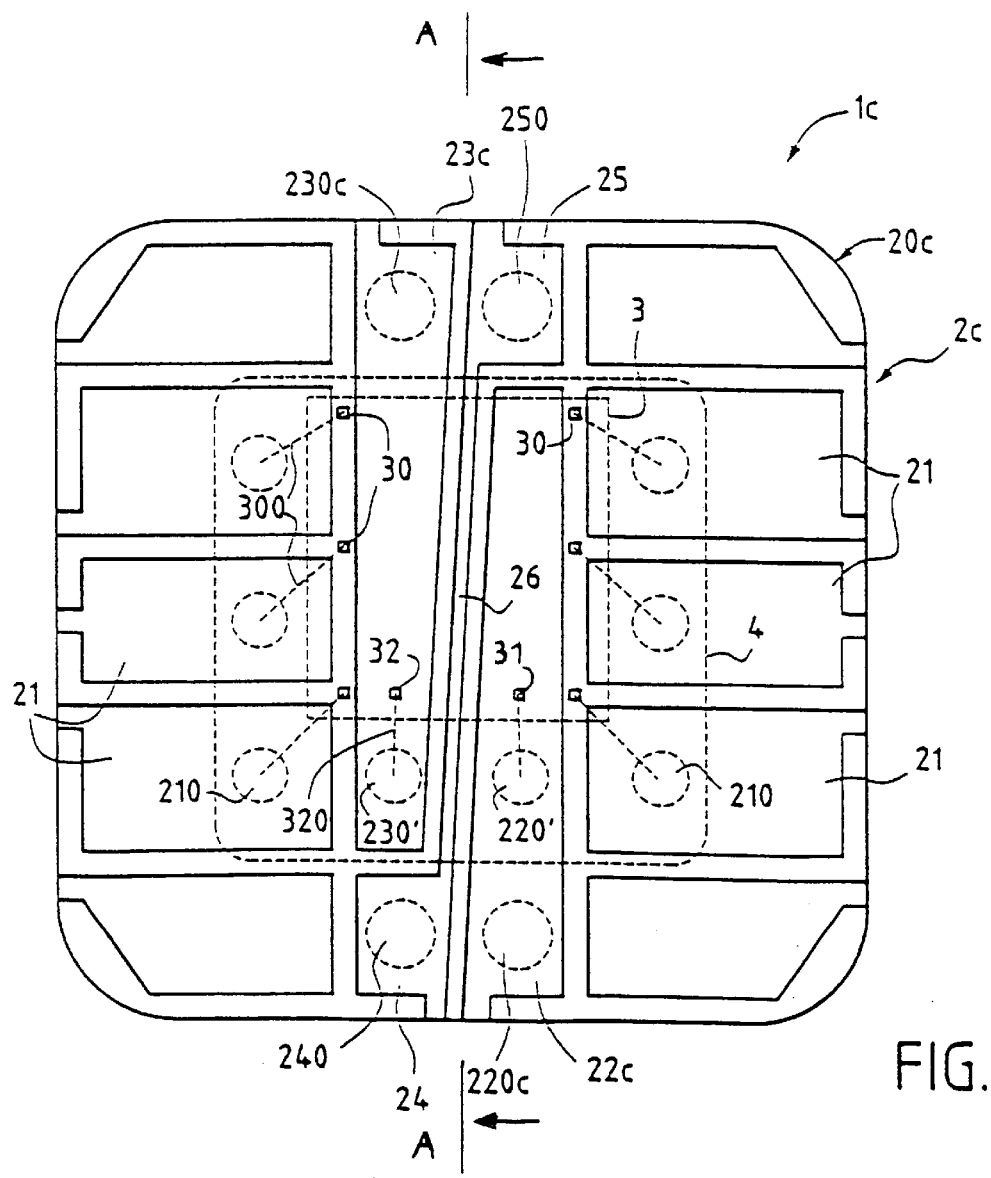
FIG. 5C illustrates a top view of a micromodule, modified to suit the third additional variant of embodiment.

A second additional variant of embodiment, which makes it possible to eliminate this drawback, is described in reference to FIGS. 5A through 5C. FIG. 5A schematically illustrates the chip card, here referenced 5c, in a top view, and FIG. 5B illustrates this same chip card in a sectional side view along AA of FIG. 5A, the micromodule, here referenced 1c, being mounted. FIG. 5C illustrates, in a top view, i.e. on the conductive contact side, this micromodule 1c, modified to suit this particular variant of embodiment.

The elements common, or at least similar, to those represented in the previous figures have the same references, and will be described again only as necessary. However, they are associated with the letter "c" if any structural modifications exist.

In the example described, it is assumed that the antenna, here referenced 6c, comprises two coils 66 and 67. These two coils are cut so that their ends can be interconnected to contact pads of the substrate 2c.

In essence, according to the chief characteristic of this second additional variant of embodiment, the connection between the coils 66 and 67, is produced by means of a plated pad 26 produced directly on the substrate 2c.

The plated tracks forming the coils 66 and 67 of the antenna 6c can be produced in the manner described in reference to FIG. 3B, i.e. on a plate on the level 515 located on an intermediate level between the bottom of the center well 510 of the cavity 51 and the bottom of the peripheral groove 511 of this same cavity, i.e. on the surface of one of the layers of plastic material constituting the body 50c of the chip card 5c.

One of the ends, or antenna terminations 660 or 671 of the coils 66 or 67 of the antenna 6c, is connected to the micromodule 1cin a way similar, if not identical, to the one described for the variant described in reference to the aforementioned FIG. 3B, via two contact pads 22c or 23c, and openings 220c or 230c, respectively.

On the other hand, a contact pad comprising two wide areas 24, 25 connected by a long, thin area 26 is provided. The areas 24 and 25 are disposed one to the right (in FIG. 5C), the other to the left of the antenna connection pads 22c and 23c, between the contact pads 21. In a variant not represented, the area 26 could be given an even larger width by reducing the size of the pads 22c and 23c. The connections between the areas 24 and 25 and the antenna terminations 670 and 661 are produced through the openings 240 and 250, holes in the insulating layer overlying the plating level 515 (one of which, 5112, is visible in FIG. 5B) and conductive pins (one of which, 241, is visible in FIG. 5B).

It should be clear that, even though the tracks 66 and 67 of the antenna 6c are produced in a first layer (plate 515), and the areas 24-25-26 between two coils are produced on a second level, this does not create an additional layer of plating. In fact, the interconnection level 24-25-26 is common to the plating level already used for the contact pads 21 through 23 (top surface of the supporting chip 2c.

It is also possible, in a variant not illustrated, to consider producing several connecting platings of the type 26, connecting additional pairs of contact pads. This way, it would be possible to interconnect more than two successive coils. However, it is clear that in practice, the number of possible interconnections produced between the pairs of contacts 22 and 23 is very limited. This variant, however, is perfectly adapted to an antenna configuration with two or three coils, which is generally the case for a frequency of 13.56 MHz.

Through the reading of the above, it is easy to see that the invention clearly achieves the objects set forth.

It should be clear, however, that the invention is not limited to just the exemplary embodiments explicitly described, particularly in connection with FIGS. 1 through 5C.

In particular, the numerical values have been indicated only to illustrate the concepts.

They essentially depend on the precise application intended. The materials that can be used are those generally used in the field. In this sense, the invention is compatible with the current technologies, which is an additional advantage.

The invention preferably applies to chip cards of the "mixed" type, but is in no way limited to this application alone. It also applies to contactless chip cards, although the advantages that can be gained are fewer than in the first case.

In essence, the invention provides many advantages, especially for chip cards of the "mixed" type, among which are the following:

low cost;

utilization of a one-sided semiconductor component substrate (printed circuit);

direct access to the additional contacts, and consequently to the high-frequency interface, which makes it possible to perform electrical tests through contact with the antenna connections and to test the input/outputs of this interface;

perfect compatibility with the methods used in the prior art for the production of the micromodules and the mounting; and the specific cavities provided for access to the antenna terminations allow for substantial tolerance in the volume of conductive material used to produce the connecting pins.

Figure 6:
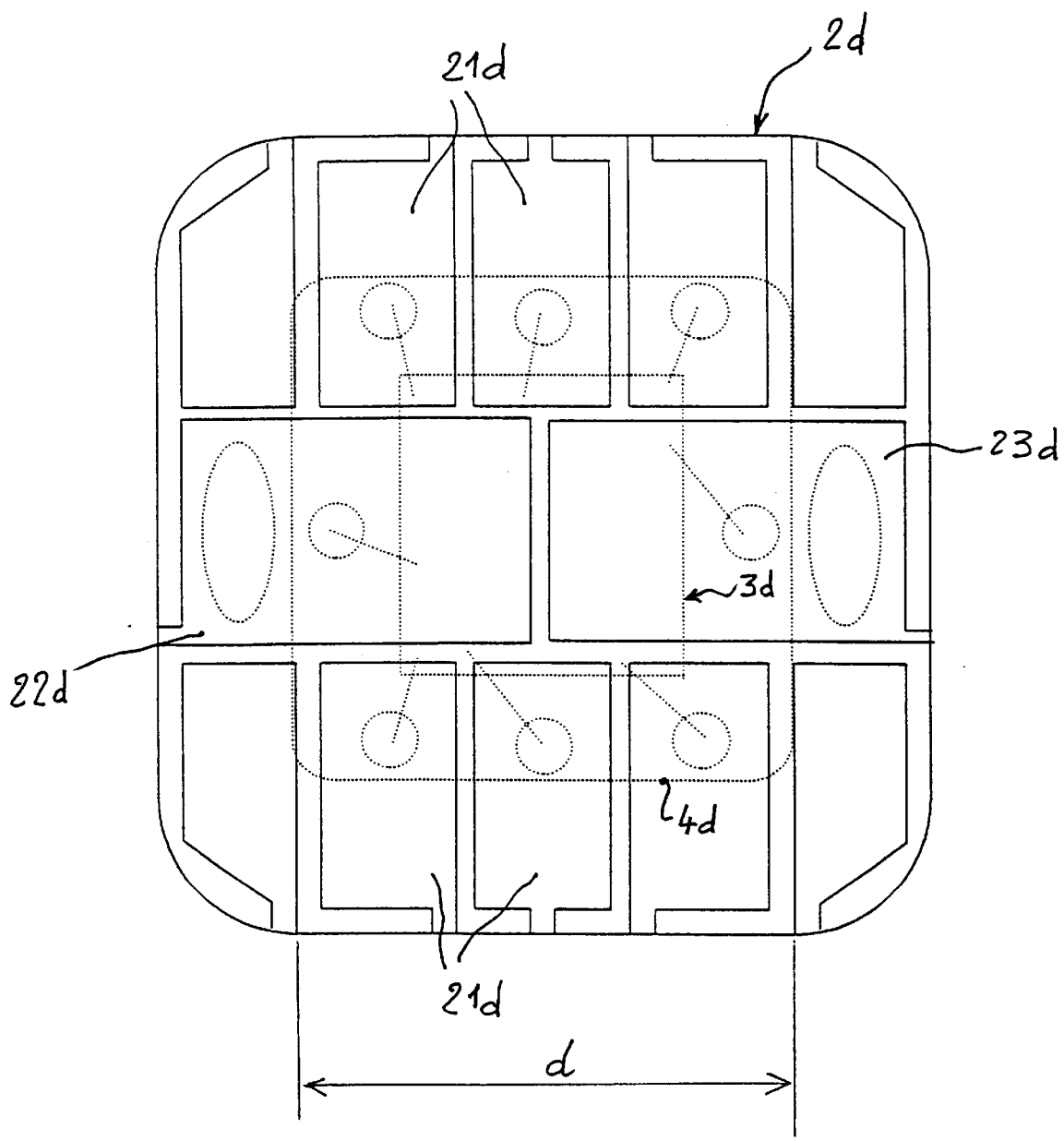
FIG. 6 represents a variant of embodiment of a micromodule, on the contact pad side

In a variant of embodiment, the input and/or output terminals of the high-frequency interface of the semiconductor component are not grouped on the same side of the component, but distributed on two opposite sides. In this variant, the connections with the contact pads are produced on both sides of the semiconductor component. Therefore, the contact pad 22 (FIG. 1) no longer necessarily extends over the semiconductor component. In short, the contact pads 22, 23 can run approximately between an edge of the semiconductor component 3 and an edge of the substrate 2 that faces it. However, preferably, the configuration of FIG. 6 will be used, wherein the contact pads 22d and 23d respectively extend from an edge of the substrate 2d to a middle region of the semiconductor component 3d, so as to cover approximately all of the center region located between the two rows of contact pads 21d. It will nevertheless be noted that, in order not to overly increase the width d of the coating area 4d and thus provide a width large enough for the lateral bonding of the substrate 2d, the layout of FIG. 6 will preferably be reserved for semiconductor components that are less wide than that of FIG. 1.

This variant of embodiment can naturally be applied to the embodiments described in reference to FIGS. 3A–3B, 4A–4B, 5A–5C.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the true spirit and full scope of the invention as set forth herein and defined in the claims.

What is claimed is:

1. A chip card, comprising:

an antenna;

a micromodule connected to the antenna and including:

(a) a substrate having first and second sides, (b) an integrated circuit chip disposed on the first side, (c) a first contact connected to one terminal end of the antenna, (d) a second contact connected to another terminal end of the antenna; and a body having a cavity, said micromodule located in said cavity chipside down, wherein said first and second contacts are disposed on the second side of said substrate, wherein said first contact is electrically connected to a terminal of said integrated circuit chip through a first hole in said substrate, and wherein said second contact is electrically connected to another terminal of said integrated circuit chip through a second hole in said substrate, and wherein said one terminal end and said another terminal end of the antenna are located in said cavity and are connected to said first and second contacts through respective third and fourth holes in said substrate.

2. A micromodule, comprising:

an insulating substrate having first and second sides, an integrated circuit chip on the first side;

a first contact connected to a terminal of said integrated circuit chip;

a second contact connected to another terminal of said integrated circuit chip; and a third contact between said first contact and said second contact, where no connection exists between said third contact and said integrated circuit chip, wherein said first contact and said second contact are located on the second side of the insulating substrate, and wherein the insulating substrate has a first hole for allowing the first contact to be connected to an external circuit and a second hole for allowing the second contact to be connected to the external circuit.

3. A chip card comprising a basic body of electrically insulating layers, an open loop antenna having two ends on one of said insulating layers, said body having a cavity, a micromodule housed in said cavity and adapted to be connected to said open loop antenna by two terminals, said micromodule comprising:

an electrically insulating substrate having a first and a second side;

a semiconductor component;

a plurality of electrical contact pads disposed on the second side, wherein at least two contact pads are disposed in a strip extending through a center region of the substrate, said terminals respectively being connected to two of said at least two contact pads, the two contact pads respectively being connected to the two ends of the antenna.

4. A chip card according to claim 3, wherein the semiconductor component is disposed on said first side of the substrate, said terminals respectively being connected to said two contact pads through said substrate.

5. A chip card according to claim 4, wherein said terminals are connected to said contact pads via first openings in said substrate and said ends of said antenna are connected to said contact pads through holes in a layer of the card interposed between the antenna and the micromodule, and through second openings in said substrate.

6. A chip card according to claim 3, wherein said antenna comprises at least two coils, and wherein two of the at least two coils are connected by interconnecting conductive segments disposed between said ends of the antenna.

7. A chip card according to claim 6, wherein said cavity comprises a center well adapted to receive said semiconductor component and a peripheral groove on which rests a periphery of said substrate, said interconnecting conductive segments being connected to the two coils and being disposed on a layer on an intermediate level between the bottom of said peripheral groove and the bottom of said center well, and extending between said ends of the antenna and the edge of said center well.

8. A chip card according to claim 7, wherein said open loop antenna comprises three coils, and a first of said interconnecting conductive segments connecting a first coil to a second coil is disposed on the edge of said center well on a first side of said semiconductor component, and a second conductive segment is disposed on the edge of said center well on the opposite side of said semiconductor component.

9. A chip card according to claim 6, wherein said cavity comprises a center well adapted to receive said semiconductor component, and a peripheral groove on which rests a periphery of said substrate, said interconnecting conductive segments connecting said two coils disposed beneath said semiconductor component and between said ends of the antenna.

10. A chip card according to claim 3, wherein said antenna comprises at least two open coils, and said substrate comprises at least one additional contact pad on the second side of the support disposed between said at least two contact pads, the additional contact pad connecting two respective ends of said open coils to one another.

11. A chip card according to claim 3, wherein the micromodule comprises two rows of contact pads, disposed on either side of said strip, at least one of the contact pads disposed to cooperate via galvanic contacts with a card reader.

12. A micromodule connected by two terminals to an open loop antenna external of the micromodule having two ends, said micromodule comprising:

an electrically insulating substrate having a first and a second side;

a semiconductor component;

on said second side, a plurality of electrical contact pads, wherein two contact pads are disposed in a strip passing through a center region of the substrate, said terminals respectively being connected to said two contact pads, the two contact pads adapted to be respectively connected to the two ends of the antenna.

13. A micromodule according to claim 12, additionally comprising two rows of contact pads disposed on either side of said strip, wherein at least one of the contact pads in these rows is adapted to cooperate via galvanic contacts with a card reader.

* * * * *